(12) United States Patent
Baluja et al.

(10) Patent No.: US 10,480,068 B2
(45) Date of Patent: Nov. 19, 2019

(54) CHAMBER LINER FOR HIGH TEMPERATURE PROCESSING

(71) Applicant: Applied Materials, Inc., Santa Clara, CA (US)

(72) Inventors: Sanjeev Baluja, Campbell, CA (US); Ren-Guan Duan, Fremont, CA (US); Kalyanjit Ghosh, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 327 days.

(21) Appl. No.: 15/434,853

(22) Filed: Feb. 16, 2017

(65) Prior Publication Data
US 2017/0275753 A1      Sep. 28, 2017

Related U.S. Application Data

(60) Provisional application No. 62/313,229, filed on Mar. 25, 2016.

(51) Int. Cl.
| C23C 16/00 | (2006.01) |
| C23C 16/44 | (2006.01) |
| C23C 16/455 | (2006.01) |

(52) U.S. Cl.
CPC .... *C23C 16/4401* (2013.01); *C23C 16/45587* (2013.01)

(58) Field of Classification Search
CPC ...................... H01J 37/32495; H01J 37/32504
See application file for complete search history.

(56) References Cited

U.S. PATENT DOCUMENTS

| 6,227,140 | B1 | 5/2001 | Kennedy et al. |
| 2001/0004478 | A1* | 6/2001 | Zhao ................... C23C 16/4411 |
| | | | 427/535 |
| 2002/0102858 | A1 | 8/2002 | Wicker et al. |
| 2003/0070620 | A1* | 4/2003 | Cooperberg ...... C23C 16/45574 |
| | | | 118/723 AN |

(Continued)

FOREIGN PATENT DOCUMENTS

WO      2009089244 A1      7/2009

OTHER PUBLICATIONS

International Search Report and Written Opinion in related application PCT/US2017/017831 dated May 24, 2017.
TW Office Action dated Apr. 17, 2019 for Application 106105536.

*Primary Examiner* — Keath T Chen
(74) *Attorney, Agent, or Firm* — Patterson + Sheridan LLP

(57) ABSTRACT

Embodiments disclosed herein generally relate to a chamber liner for the high temperature processing of substrates in a processing chamber. The processing chamber utilizes an inert bottom purge flow to shield the substrate support from halogen reactants such that the substrate support may be heated to temperatures greater than about 650 degrees Celsius. The chamber liner controls a flow profile such that during deposition the bottom purge flow restricts reactants and by-products from depositing below the substrate support. During a clean process, the bottom purge flow restricts halogen reactants from contacting the substrate support. As such, the chamber liner includes a conical inner surface angled inwardly to direct purge gases around an edge of the substrate support and to reduce deposition under the substrate support and the on the edge.

19 Claims, 3 Drawing Sheets

(56) References Cited

U.S. PATENT DOCUMENTS

| | | | |
|---|---|---|---|
| 2004/0069223 A1* | 4/2004 | Tzeng | H01J 37/32477 118/715 |
| 2004/0089240 A1 | 5/2004 | Dando et al. | |
| 2004/0262155 A1* | 12/2004 | Lombardi | C23C 14/54 204/298.01 |
| 2005/0271812 A1* | 12/2005 | Myo | C23C 16/0272 427/248.1 |
| 2011/0287632 A1 | 11/2011 | Brown et al. | |
| 2013/0087286 A1* | 4/2013 | Carducci | H05H 1/46 156/345.43 |
| 2016/0312359 A1* | 10/2016 | Dubois | C23C 16/4401 |

* cited by examiner

CHAMBER LINER FOR HIGH TEMPERATURE PROCESSING

CROSS-REFERENCE TO RELATED APPLICATIONS

This application claims benefit of U.S. provisional patent application Ser. No. 62/313,229, filed Mar. 25, 2016, which is hereby incorporated herein by reference.

BACKGROUND

Field of the Disclosure

Embodiments described herein generally relate to a chamber liner for a semiconductor process chamber and a semiconductor process chamber having a chamber liner. More specifically, embodiments disclosed herein relate to a chamber liner for processing temperatures greater than about 650 degrees Celsius while shielding chamber components from halogen damage.

Description of the Related Art

In the fabrication of integrated circuits, deposition processes such as chemical vapor deposition (CVD) or plasma enhanced CVD processes are used to deposit films of various materials upon semiconductor substrates. These depositions may take place in an enclosed process chamber. The process gases used in the depositions deposit films on the substrate, but may also deposit residue on the internal walls and other components of the process chamber. This residue builds up as more substrates are processed in the chamber and leads to generation of particles and other contaminants. These particles and contaminants can lead to the degradation of the deposited films on the substrates causing product quality issues. Process chambers must be periodically cleaned to remove the deposited residue on the chamber components.

A chamber liner may be disposed in the chamber to define a processing region in a desired location within the chamber with respect to the substrate. The chamber liner may be configured to assist in confining the plasma to the processing region and help prevent other components in the chamber from being contaminated with deposited materials, such as the residue mentioned above. The process gases may be supplied above a substrate support. A purge gas may be provided from below the substrate support to prevent process gases from reaching areas at the bottom of the chamber and causing deposit of residue in the areas below the substrate support. The process gas and the purge gas may be removed from the process chamber using a common exhaust disposed away from the process area, such as around an outer perimeter of the process chamber, to prevent mixing of the purge gas with the process gas in the process area. Using the arrangement described above, particle formation can occur in the process area above the substrate and cause defects in the products made in the process chamber.

Furthermore, substrate processing temperatures are typically capped between about 400 degrees Celsius and about 480 degrees Celsius for silicon based depositions due to the aggressive erosion and corrosion by the halogen clean on the high temperature components. As such, optimal film quality is often sacrificed due to manufacturability and reliability concerns.

Thus, there is a need for an improved liner for a process chamber to prevent particle formation and/or to permit significantly higher substrate processing temperatures while shielding sensitive components from halogen damage.

SUMMARY

Embodiments disclosed herein generally relate to chamber liners used to optimize flow profiles is a plasma process chamber. The chamber liners disclosed herein may allow for the high temperature processing of substrates in a processing chamber. The processing chamber utilizes an inert bottom purge flow to shield the substrate support from halogen reactants such that the substrate support may be heated to temperatures greater than about 650 degrees Celsius. The chamber liner controls a flow profile such that during deposition the bottom purge flow restricts reactants and by-products from depositing below the substrate support. During a clean process, the bottom purge flow restricts halogen reactants from contacting the substrate support. As such, the chamber liner includes a conical inner surface angled inwardly to direct purge gases around an edge of the substrate support and to reduce deposition under the substrate support and on the edge of the substrate.

In one embodiment, a chamber liner is disclosed. The chamber liner includes an annular bottom portion defining an opening in a center region therein and a sidewall portion extending from the annular bottom portion. The sidewall portion has a first inner surface, a second inner surface, and a conical inner surface connecting the first inner surface and the second inner surface. The first inner surface is adjacent the annular bottom portion and has a first diameter. The second inner surface has a second diameter. The second diameter is less than the first diameter. The conical inner surface extends between the first inner surface and the second inner surface and is angled inwardly from the first inner surface to the second inner surface.

In another embodiment, a chamber liner is disclosed. The chamber liner includes an annular bottom portion defining an opening in a center region therein and a sidewall portion extending from the annular bottom portion. The sidewall portion has a first inner surface, a second inner surface, and a conical inner surface. The first inner surface is adjacent the annular bottom portion and has a first diameter. The second inner surface has a second diameter. The second diameter is less than the first diameter. The conical inner surface extends between the first inner surface and the second inner surface. Furthermore, the conical inner surface is angled inwardly from the first inner surface to the second inner surface at an angle of between about 30 degrees and about 75 degrees relative to a horizontal plane defined by the annular bottom portion.

In another embodiment, a processing chamber is disclosed. The processing chamber includes a chamber body defining a processing volume, a substrate support disposed in the processing volume, and a liner disposed in the processing volume adjacent the substrate support. The liner includes an annular bottom portion defining an opening in a center region therein and a sidewall portion extending from the annular bottom portion. The sidewall portion has a first inner surface, a second inner surface, and a conical inner surface. The first inner surface is adjacent the annular bottom portion and has a first diameter. The second inner surface has a second diameter. The second diameter is less than the first diameter. The conical inner surface extends between the first inner surface and the second inner surface and is angled inwardly from the first inner surface to the second inner surface.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments disclosed herein generally relate to a chamber liner for the high temperature processing of substrates in a processing chamber. The processing chamber utilizes an inert bottom purge flow to shield the substrate support from halogen reactants such that the substrate support may be heated to temperatures greater than about 650 degrees Celsius. The chamber liner controls a flow profile such that during deposition the bottom purge flow restricts reactants and by-products from depositing below the substrate support. During a clean process, the bottom purge flow restricts halogen reactants from contacting the substrate support. As such, the chamber liner includes a conical inner surface angled inwardly to direct purge gases around an edge of the substrate support and to reduce deposition under the substrate support and the on the edge.

Figure 1A:
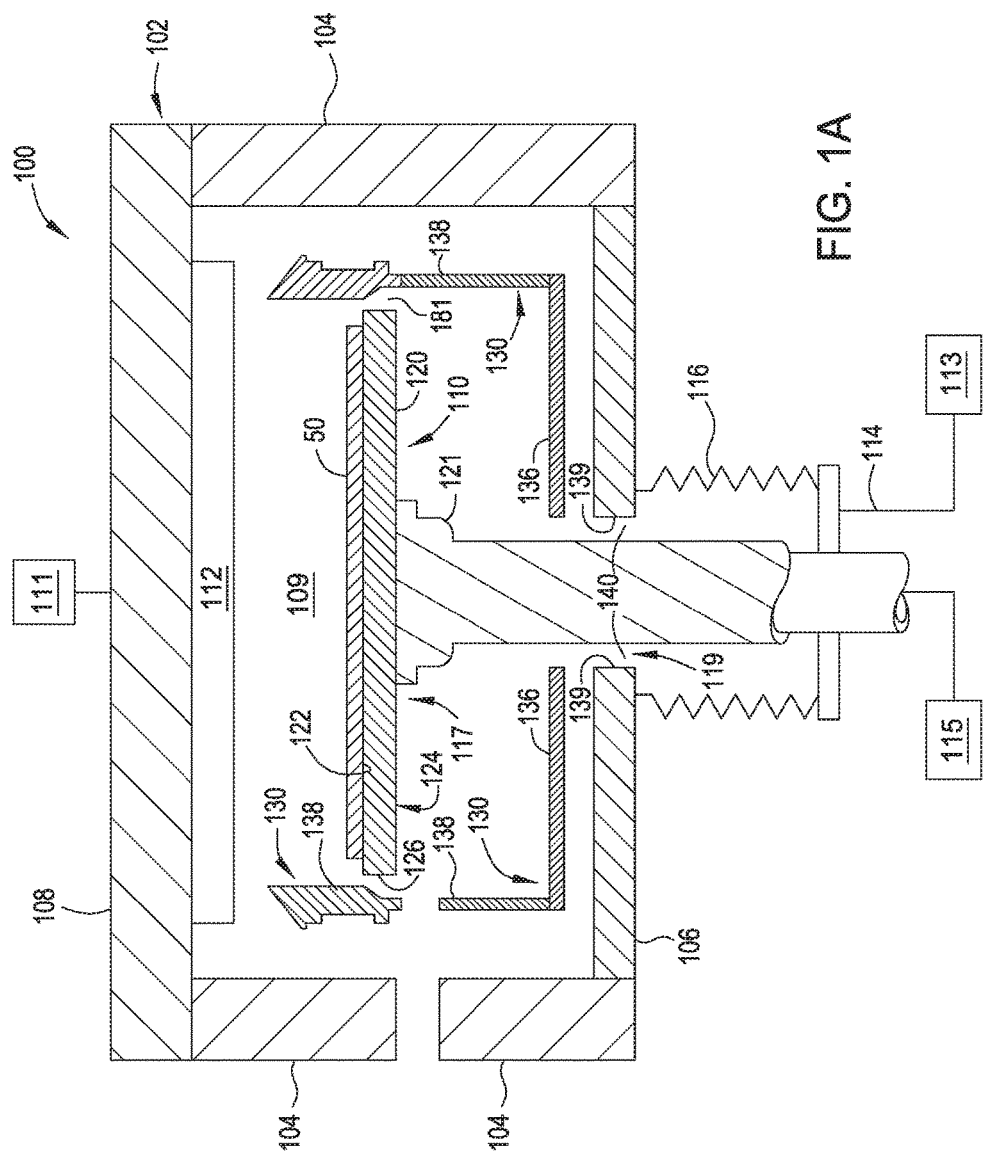
FIG. 1A is a side sectional view of a process chamber including a chamber liner disposed around a substrate support in a raised position, according to one embodiment of the disclosure.
Figure 1B:
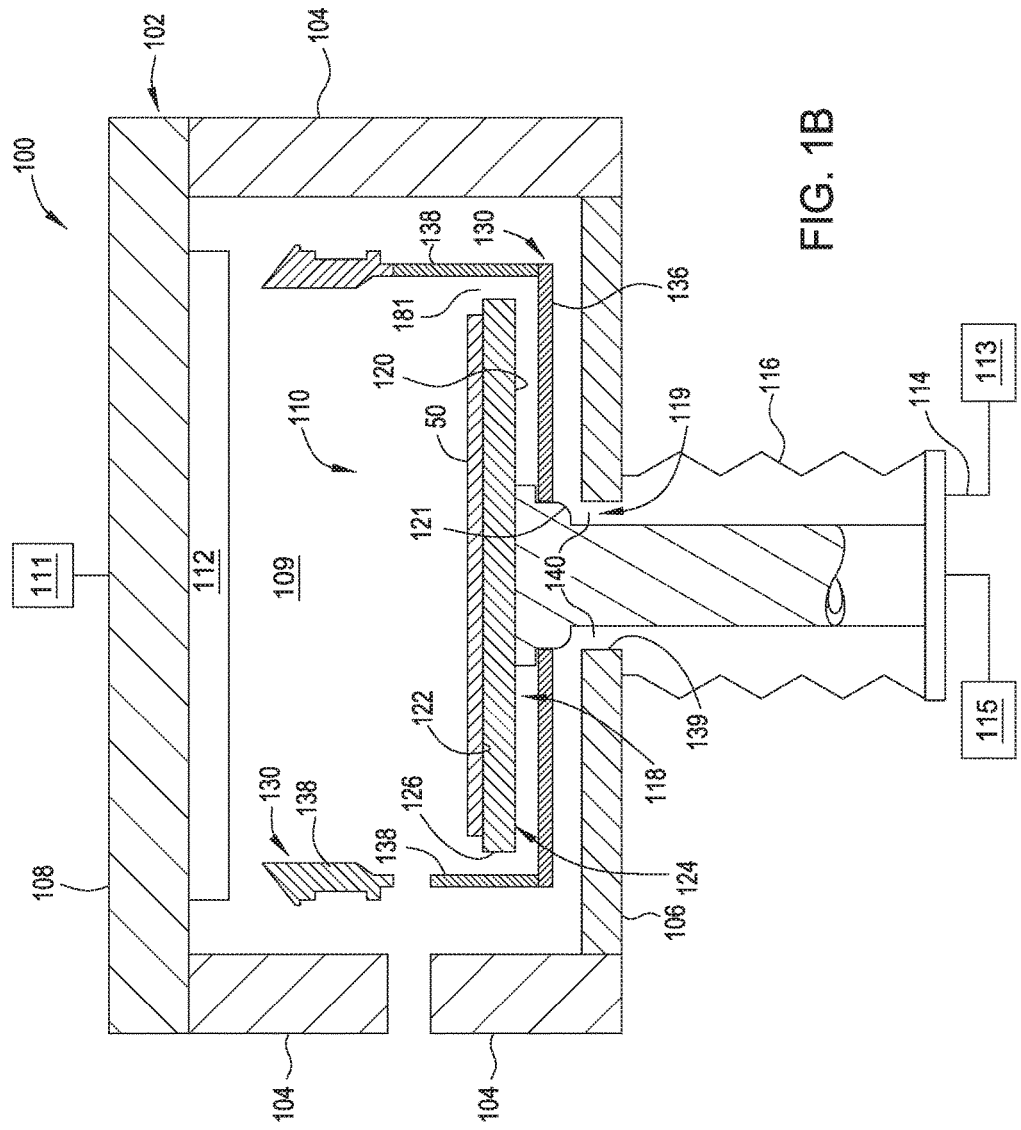
FIG. 1B is a side sectional view of the process chamber including the chamber liner disposed around the substrate support in a lowered position, according to one embodiment of the disclosure.
Figure 2A:
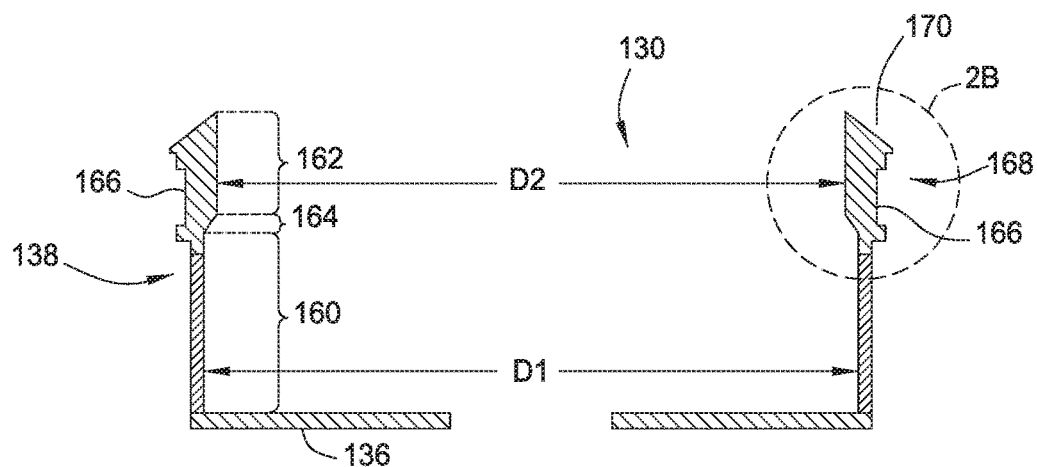
FIG. 2A is a cross-sectional side view of the chamber liner, according to one embodiment of the disclosure.
Figure 2B:
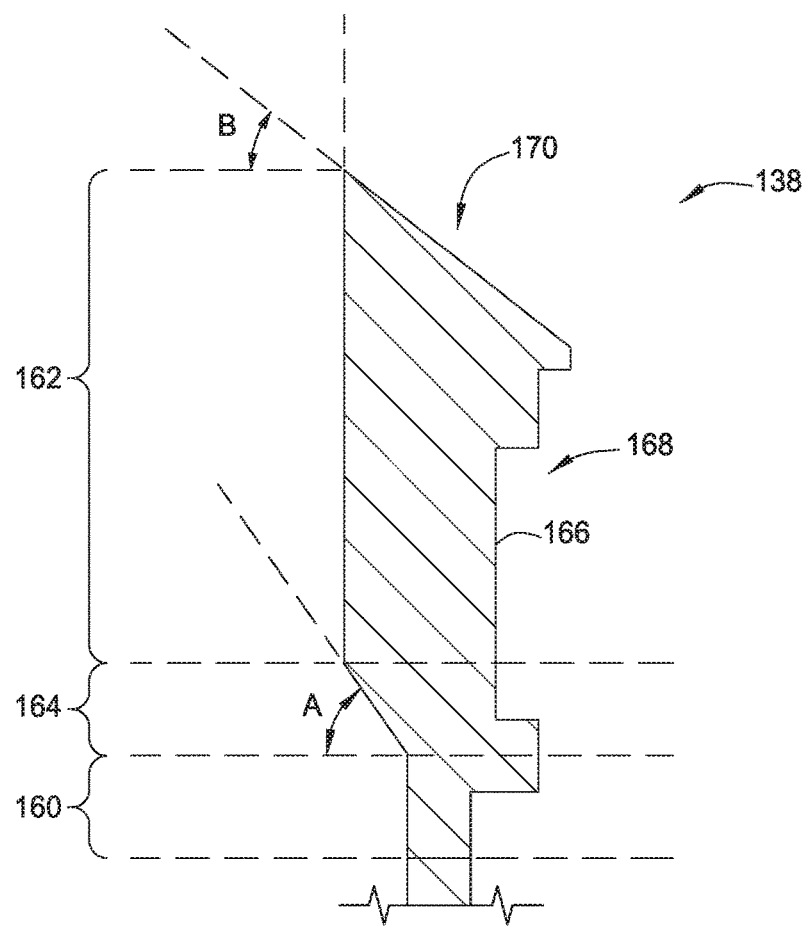
FIG. 2B is an enlarged cross-sectional side sectional view of a portion of the chamber liner, according to another embodiment of the disclosure.

FIG. 1A is a side sectional view of a process chamber 100 including a chamber liner 130 disposed around the substrate support 120 in a raised position 117, according to one embodiment of the disclosure. FIG. 1B is a side sectional view of the process chamber 100 including the chamber liner 130 disposed around the substrate support 120 in a lowered position 118, according to one embodiment of the disclosure. The sectional views of FIGS. 1A and 1B as well as FIGS. 2A and 2B shown below are cross-sectional views, so that parts behind or at other depths through the plane of the Figure are not shown in the drawings for clarity. For example, FIG. 1A may further include additional parts of a process kit, however, certain parts were omitted in order to not clutter the drawing and to make the gas flow of the process gas and purge gas discussed below easier to understand.

The chamber liner 130 is configured to reduce particle deposition on the chamber components and prevent purge gas from entering a process volume 109 above the substrate support 120, which advantageously reduces defects and increases the service interval. The chamber liner 130 controls a flow profile of a purge gas such that during deposition the bottom purge flow restricts reactants and/or by-products from depositing below the substrate support 120. By way of example only, purge gases may include inert gases and/or $O_2$, among others.

The process chamber 100 includes a chamber body 102 having one or more side walls 104, a bottom 106, and a lid 108 disposed on the side walls 104. The side walls 104, bottom 106, and lid 108 define an interior volume 110 of the process chamber 100. The process chamber 100 includes a gas distribution plate 112 and the substrate support 120. The region between the substrate support 120 in the raised position 117 (FIG. 1A) and the gas distribution plate 112 is defined by the process volume 109. The gas distribution plate 112 supplies process gases from a process gas source 111 to the process volume 109. The process chamber 100 may be a plasma chamber, such as a chamber including a plasma source (e.g., a capacitively coupled plasma chamber with a RF-hot gas distribution plate) or a chamber connected to a remote plasma source (RPS).

The substrate support 120 is disposed in the interior volume 110. The substrate support 120 may be formed of a ceramic material, such as aluminum nitride. The substrate support 120 may include an electrostatic chuck, a ceramic body, a heater, a vacuum chuck, a susceptor, or a combination thereof. The substrate support 120 has a substrate supporting surface 122 that receives and supports a substrate 50 during processing. During a clean process, the substrate supporting surface 122 of the substrate support 120 may receive a cover substrate to protect the underlying substrate support 120. In some embodiments, the cover substrate may comprise a halogen resistant material. The substrate support 120 is coupled to a supporting shaft 121 that is coupled to a lift mechanism 115 below the bottom 106 of the process chamber 100. A bellows 116 may disposed around the portion of the supporting shaft 121 that is below the bottom 106 of the process chamber to isolate the supporting shaft 121 from the external environment. The lift mechanism 115 is configured to move the substrate support 120 between the raised position 117 (see FIG. 1A) and the lowered position 118 (see FIG. 1B). The substrate support 120 may be placed in the raised position 117 for processing of the substrate 50. In the lowered position 118, a robot or other transfer mechanism may be used to place the substrate 50 in the process chamber 100, such as placing the substrate 50 on lift pins (not shown) extending above the substrate support 120.

The substrate support 120 further includes a bottom surface 124 and an outer surface 126. In some embodiments, the outer surface of the substrate support 120 may be angled. The outer angled surface may extend outwardly from the bottom surface 124 to the outer surface 126.

A purge gas may be supplied to the process chamber 100 during processing or cleaning of the process chamber 100. The purge gas may be supplied from a purge gas source 113 through a purge gas line 114. In some embodiments, the purge gas line 114 may be coupled to the process chamber 100 through the bellows 116 in order to maintain a positive pressure in the bellows during movement of the substrate support 120 by the lift mechanism 115. The purge gas may be oxygen, or an inert gas, such as nitrogen or argon. The purge gas helps to prevent process gases from the gas distribution plate 112 from entering portions of the interior volume 110 below the substrate support 120 and depositing on any of the components below the substrate support 120. Prevention of process gases below the substrate support 120 avoids unnecessary cleaning of the components below the substrate support 120. Thus, using the purge gas reduces overall clean time and increases throughput of the process chamber 100.

The chamber liner 130 is disposed adjacent the substrate support 120 within the process volume 109. In some embodiments, the chamber liner 130 can surround the substrate support 120 and the supporting shaft 121. The chamber liner 130 may be disposed between the substrate support 120 and the side walls 104. The chamber liner 130 protects the side walls 104 of the process chamber 100 from energized gases during processing and cleaning of the process chamber 100. The chamber liner 130 includes an annular bottom portion 136, an a sidewall portion 138. The annular bottom portion 136 defines an opening 139 in a center region 140 through which the purge gas inlet 119 may allow a purge gas to flow up through the first gap 181. The sidewall portion 138 extending outward from the annular bottom portion 136. As shown in FIGS. 1A and 1B, the sidewall portion 138 extends radially outward from the annular bottom portion 136 toward the substrate support 120. The chamber liner 130 may be formed of a material which does not react with fluorine. In some embodiments, the chamber liner 130 may comprise a quartz material, an $Al_2O_3$ material, a ceramic coated aluminum material, a stainless steel material, or combinations and mixtures thereof. The chamber liner 130, in some embodiments, may form a continuous surface surrounding (i.e., 360 degrees) at least part of the substrate support 120 and/or at least part of the supporting shaft 121. In other embodiments, there may be one or more gaps between portions of the chamber liner 130 to accommodate other components, but the chamber liner 130 may still substantially surround the substrate support 120 and the supporting shaft 121.

FIG. 2A is a side sectional view of the chamber liner 130, according to one embodiment of the disclosure. FIG. 2B is enlarged sectional side sectional view of a portion of the chamber liner 130, allowing for further details of the chamber liner 130 to be shown.

As shown, the sidewall portion 138 of the chamber liner 130 includes a first inner surface 160 and a second inner surface 162. The first inner surface 160 is adjacent the annular bottom portion 136. The first inner surface 160 and the second inner surface 162 may be substantially normal relative to a horizontal plane defined by the annular bottom portion 136.

The first inner surface 160 has a first diameter D1, as shown in FIG. 2A. The second inner surface 162 has a second diameter D2, as also shown in FIG. 2A. The second diameter D2 is less than the first diameter D1. For example, in some embodiments, the first diameter D1 may be between about 13.3 inches and about 14.0 inches, such as about 13.5 inches, while the second diameter D2 may be between about 12.0 inches and about 13.29 inches, such as about 13.1 inches. The sidewall portion 138 further includes a conical inner surface 164. The conical inner surface 164 extends between the first inner surface 160 and the second inner surface 162. The conical inner surface 164 is angled inwardly from the first inner surface 160 to the second inner surface 162. In some embodiments, the conical inner surface 164 is oriented at an angle A. The angle A may range from about 20 degrees to about 80 degrees from a horizontal plane (e.g., the X-Y plane), such as from about 40 degrees to about 75 degrees from the horizontal plane. In some embodiments, the horizontal plane may be defined by annular bottom portion 136. The diameter of the conical inner surface 164 may gradually decrease from the first inner surface 160 to the second inner surface 162.

The sidewall portion 138 further includes a first outer surface 168 and a second outer surface 170. The first outer surface 168 comprises a notch 166 disposed therein. The second outer surface 170 may be angled, and in some embodiments, the second outer surface 170 may be angled inwardly towards the opening 139 in the center region 140. In some embodiments, the second outer surface is angled inwardly at an angle B between about 20 degrees and about 80 degrees, for example, between about 30 degrees, and about 65 degrees, such as about 38 degrees, relative to a horizontal plane defined by the annular bottom portion 136. In other embodiments, the second outer surface 170 may be angled substantially parallel to the conical inner surface 164 of the sidewall portion 138.

Benefits of the disclosure include the shielding of sensitive components from halogen damage such that a processing temperature greater than 650 degrees Celsius may be had, thus increasing and improving film quality and properties.

Testing was performed and results indicated approximately a 70% reduction in $NF_3$ faction at or near the edge of the substrate, when a test substrate was utilized to shield the substrate support until the edge of the substrate support was reached. Further testing indicated that, at a processing temperature of about 480 degrees Celsius, approximately 5000-10000 substrates may be processed between cleans, while at a processing temperature of about 550 degrees Celsius, approximately 2000 substrate may be processed between cleans. Moreover, at a processing temperature of about 650 degrees Celsius, approximately 100 substrates may be processed between cleans.

To summarize, the embodiments disclosed herein relate to a chamber liner for the high temperature processing of substrates in a processing chamber. The processing chamber utilizes an inert bottom purge flow to shield the substrate support from halogen reactants such that the substrate support may be heated to temperatures greater than about 650 degrees Celsius. The chamber liner controls a flow profile such that during deposition the bottom purge flow restricts reactants and by-products from depositing below the substrate support. During a clean process, the bottom purge flow restricts halogen reactants from contacting the substrate support. As such, the chamber liner includes a conical inner surface angled inwardly to direct purge gases around an edge of the substrate support and to reduce deposition under the substrate support and the on the edge.

While the foregoing is directed to embodiments of the present disclosure, other and further embodiments of the disclosure may be devised without departing from the basic scope thereof, and the scope thereof is determined by the claims that follow.

What is claimed is:

1. A chamber liner, comprising:
an annular bottom portion configured to extend underneath a substrate support positioned in a processing chamber and defining an opening in a center region therein underneath the substrate support; and
a sidewall portion extending from the annular bottom portion, the sidewall portion having:
a first sidewall portion having a first outer diameter, a first inner diameter and a first inner surface;
a second sidewall portion having a second outer diameter, wherein the second outer diameter is greater than the first outer diameter, and the first sidewall portion is disposed between the second sidewall portion and the annular bottom portion, the second sidewall portion having a second inner surface configured to define a processing region that is disposed above the substrate support during processing and having a second inner diameter, wherein the second inner diameter is less than the first inner diameter; and a conical inner surface extending between the first inner surface and the second inner surface, wherein the conical inner surface is angled inwardly from the first inner surface to the second inner surface, wherein the sidewall portion is disposed within the processing chamber and spaced apart from inner surfaces of the processing chamber.

2. The chamber liner of claim 1, wherein the annular bottom portion and the sidewall portion each further comprise a material selected from a group of a quartz material, an $Al_2O_3$ material, a ceramic coated aluminum material, a stainless steel material, or combinations and mixtures thereof.

3. The chamber liner of claim 1, wherein the sidewall portion further comprises a first outer surface having a notch disposed within the first outer surface.

4. The chamber liner of claim 1, wherein the sidewall portion further comprises a first outer surface and a second outer surface, wherein the second outer surface defines a top surface of the sidewall portion, wherein the top surface of the sidewall portion is angled and extends without interruption from the second inner surface to the first outer surface.

5. The chamber liner of claim 4, wherein the second outer surface is angled without interruption from the first outer surface to the second inner surface.

6. The chamber liner of claim 4, wherein the second outer surface is angled between about 30 degrees and about 75 degrees relative to a horizontal plane defined by the annular bottom portion.

7. The chamber liner of claim 4, wherein the second outer surface is parallel to the conical inner surface of the sidewall portion.

8. The chamber liner of claim 1, wherein the first inner surface and the second inner surface are substantially normal relative to a horizontal plane defined by the annular bottom portion.

9. A chamber liner, comprising:
an annular bottom portion defining an opening in a center region therein; and
a sidewall portion extending from the annular bottom portion, the sidewall portion having:
a first inner surface having a first diameter;
a second inner surface having a second diameter, wherein the second diameter is less than the first diameter, wherein the first inner surface is disposed between the second inner surface and the annual bottom portion;
a conical inner surface extending between the first inner surface and the second inner surface, wherein the conical inner surface is angled inwardly from the first inner surface to the second inner surface at an angle of between about 45 degrees and about 75 degrees relative to a horizontal plane defined by the annular bottom portion; and
a first outer surface and a second outer surface, the second outer surface defines a top surface of the sidewall portion, wherein the top surface of the sidewall portion is angled and extends without interruption from the second inner surface to the first outer surface,
wherein the sidewall portion is configured to be disposed within a processing chamber and the sidewall portion is spaced apart from inner surfaces of the processing chamber.

10. The chamber liner of claim 9, wherein the annular bottom portion and the sidewall portion each further comprise a material selected from a group of a quartz material, an $Al_2O_3$ material, a ceramic coated aluminum material, a stainless steel material, or combinations and mixtures thereof.

11. The chamber liner of claim 9, wherein the sidewall portion further comprises a notch disposed within the first outer surface.

12. The chamber liner of claim 9, wherein the second outer surface is angled downward from the second inner surface to the first outer surface.

13. The chamber liner of claim 12, wherein the second outer surface is angled downward from the second inner surface to the first outer surface at an angle between about 30 degrees and about 75 degrees relative to a horizontal plane defined by the annular bottom portion.

14. The chamber liner of claim 12, wherein the second outer surface is parallel to the conical inner surface of the side wall portion.

15. The chamber liner of claim 12, wherein the first inner surface and the second inner surface are substantially normal relative to a horizontal plane defined by the annular bottom portion.

16. A processing chamber, comprising:
a chamber body defining a processing volume;
a substrate support disposed in the processing volume having a supporting shaft disposed through an opening in a bottom wall of the chamber body; and
a liner disposed in the processing volume, the liner comprising:
an annular bottom portion having an opening in a center region thereof, wherein the supporting shaft is configured to be positioned within the opening; and
a sidewall portion extending from the annular bottom portion, the sidewall portion having:
a first inner surface having a first diameter;
a second inner surface having a second diameter, wherein the second diameter is less than the first diameter, wherein the first inner surface is disposed between the second inner surface and the annular bottom portion;
a conical inner surface extending between the first inner surface and the second inner surface, wherein the conical inner surface is angled inwardly from the first inner surface to the second inner surface; and
a first outer surface and a second outer surface, the second outer surface defines a top surface of the sidewall portion, wherein the top surface of the sidewall portion is angled and extends without interruption from the second inner surface to the first outer surface, wherein the sidewall portion is disposed within the processing chamber and spaced apart from inner surfaces of the processing chamber.

17. The processing chamber of claim 16, wherein the annular bottom portion and the sidewall portion each further comprise a material selected from a group of a quartz material, an $Al_2O_3$ material, a ceramic coated aluminum material, a stainless steel material, or combinations and mixtures thereof.

18. The processing chamber of claim 16, wherein the conical inner surface is angled between about 45 degrees and about 75 degrees relative to a horizontal plane defined by the annular bottom portion.

19. The processing chamber of claim 16, wherein the second outer surface is angled downward from the second inner surface to the first outer surface.

* * * * *